(12) United States Patent
Goenaga et al.

(10) Patent No.: US 7,785,489 B2
(45) Date of Patent: Aug. 31, 2010

(54) SOLVENT FORMULATIONS FOR SOLUTION DEPOSITION OF ORGANIC MATERIALS ONTO LOW SURFACE ENERGY LAYERS

(75) Inventors: Alberto Goenaga, Goleta, CA (US); Paul Anthony Sant, Santa Barabara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 695 days.

(21) Appl. No.: 11/644,439

(22) Filed: Dec. 22, 2006

(65) Prior Publication Data

US 2007/0221885 A1    Sep. 27, 2007

Related U.S. Application Data

(60) Provisional application No. 60/754,386, filed on Dec. 28, 2005.

(51) Int. Cl.
- C09K 11/06 (2006.01)
- C09K 11/02 (2006.01)
- C09D 5/24 (2006.01)

(52) U.S. Cl. .............. 252/301.16; 252/364; 252/500; 252/501.1; 428/917

(58) Field of Classification Search ............ 252/301.16, 252/364, 500, 501.1; 428/690, 917; 106/31.15, 106/31.32, 31.64
See application file for complete search history.

(56) References Cited

U.S. PATENT DOCUMENTS

| | | | |
|---|---|---|---|
| 6,303,238 B1 | 10/2001 | Thompson et al. | |
| 7,250,461 B2 | 7/2007 | Hsu et al. | 524/445 |
| 7,351,358 B2 | 4/2008 | Hsu et al. | 252/500 |
| 7,371,336 B2 | 5/2008 | Hsu et al. | 252/301.35 |
| 7,390,438 B2 | 6/2008 | Hsu et al. | 252/500 |
| 7,455,793 B2 | 11/2008 | Hsu et al. | 252/500 |
| 2005/0222333 A1 | 10/2005 | Hsu | 525/178 |
| 2006/0084763 A1 | 4/2006 | Arhart et al. | 525/192 |

FOREIGN PATENT DOCUMENTS

| | | |
|---|---|---|
| EP | 0294061 B1 | 9/1993 |
| EP | 1191612 A2 | 3/2002 |
| EP | 1191614 A2 | 3/2002 |
| WO | WO92/03490 | 3/1992 |
| WO | WO94/15441 | 7/1994 |
| WO | WO96/20253 | 7/1996 |
| WO | WO98/04610 | 2/1998 |
| WO | WO00/70655 | 11/2000 |
| WO | WO01/41512 A1 | 6/2001 |
| WO | WO01/62822 A1 | 8/2001 |
| WO | WO01/62869 A1 | 8/2001 |
| WO | WO01/66618 A1 | 9/2001 |
| WO | WO02/15645 | 2/2002 |
| WO | WO2005/049689 A2 | 6/2005 |
| WO | WO2005/052027 A1 | 6/2005 |

*Primary Examiner*—C. Melissa Koslow
(74) *Attorney, Agent, or Firm*—John H. Lamming

(57) ABSTRACT

Compositions for improved liquid deposition of active material in manufacturing processes of electronic devices are provided. The compositions comprise at least one active material for liquid deposition, at least one first solvent, at least one second solvent, and at least one third solvent, with a fourth solvent optional. The solvents are selected on the basis of their co-miscibility, ability to form a composition with each other and with active material without significant precipitation of active material from the composition, and at least one of the solvents having a surface tension equal to or less than that of the substrate upon which active material is to be deposited.

19 Claims, 2 Drawing Sheets

SOLVENT FORMULATIONS FOR SOLUTION DEPOSITION OF ORGANIC MATERIALS ONTO LOW SURFACE ENERGY LAYERS

CROSS REFERENCE TO RELATED APPLICATION

This application claims priority under 35 U.S.C. §119(e) from U.S. Provisional Application No. 60/754,386, filed Dec. 28, 2005, which is incorporated by reference herein as if fully set forth.

FIELD OF THE INVENTION

The invention relates generally to solvent formulations useful in the deposition of organic materials onto low surface energy surfaces.

BACKGROUND INFORMATION

Organic electronic devices play an important role in industry. For example, organic light emitting diodes (OLEDs) are promising for display applications due to their high power conversion efficiency and low processing costs. Such displays are especially promising for battery-powered, portable electronic devices, including cell-phones, personal digital assistants, handheld personal computers, and DVD players. These applications call for displays with high information content, full color, and fast video rate response time in addition to low power consumption. OLED's typically contain electroluminescent (EL) layers arranged between an anode and a cathode. Each EL layer contributes to the overall performance of the display. Thus, when manufacturing a display containing an OLED, each EL layer is carefully deposited in a controlled fashion onto a suitable underlying surface.

One cost-efficient method for deposition of EL layers in the manufacture of such displays is solution deposition. Solution deposition typically involves depositing a layer from solution using a variety of well-known techniques, such as, e.g., spin coating and ink-jetting. In certain devices, the electrically conductive polymers or other organic charge transporting materials are used. During the manufacture of the organic electronic device, the layer of the organic materials using solution processing techniques to create the device can create challenges. In particular, it is not unusual for the solvent(s) used to dissolve certain of the device's organic charge transport materials (e.g., whether photoactive, emissive, hole transporting or electron transporting) and also do not permit good deposition during manufacture in that the solution may not wet or spread sufficiently over the layer onto which it being deposited. As such, one area currently drawing the attention of researchers is the identification of solvents for optimum solution deposition properties, which in turn results in cost-efficient production of devices containing OLED displays.

BRIEF DESCRIPTION OF THE DRAWINGS

Embodiments are illustrated in the accompanying figures to improve understanding of concepts as presented herein.

Figure 1:
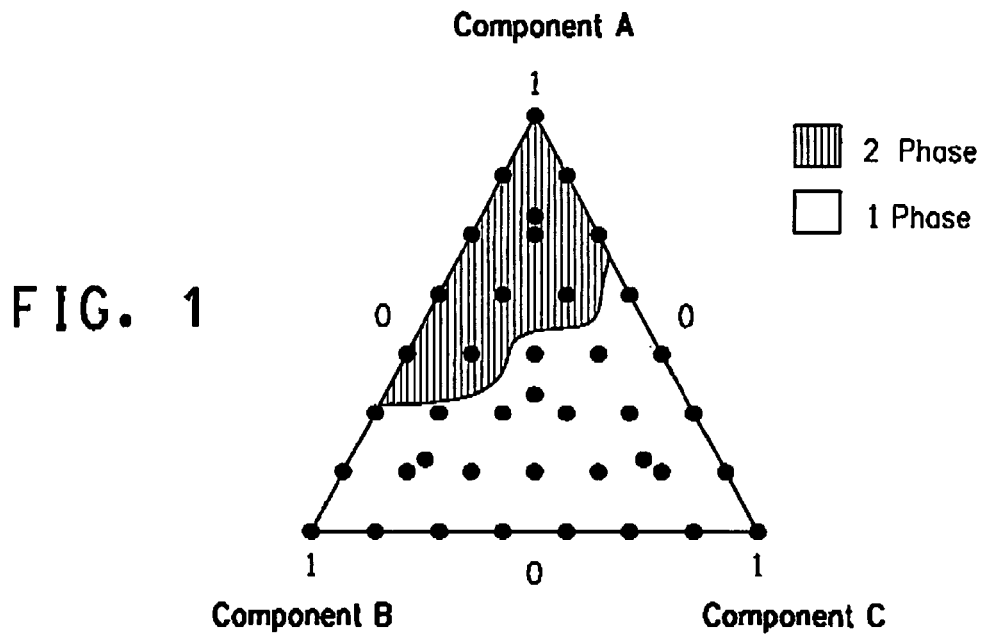
FIG. 1 is a Phase Diagram for three non-specific solvents to illustrate how one might determine the precise ratio of various solvents useful in a variety of embodiments of the compositions described herein.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION OF THE INVENTION

Many aspects and embodiments have been described above and are merely exemplary and not limiting. After reading this specification, skilled artisans appreciate that other aspects and embodiments are possible without departing from the scope of the invention. Other features and benefits of any one or more of the embodiments will be apparent from the following detailed description.

It has been found that the ability to use liquid deposition techniques for depositing active materials during the manufacture process, in creating electronic devices, is improved by using a composition having:

at least three solvents and at least one active material, wherein at least a first solvent is selected based on its ability to dissolve, suspend, or otherwise disperse the active material(s) in the composition;

at least one second solvent is selected based on it having a surface tension equal to or lower than the surface tension of the dry film or layer onto which the composition is ultimately to be deposited; and at least one third solvent that is selected based on its ability to enhance the miscibility of the first and second solvents in the composition while not leading to a significant amount of precipitation of the active material from the composition.

In one embodiment the first solvent(s) comprises of from 15-90% by volume of the liquid used in the composition, the second solvent(s) comprises from 9-84% by volume of the liquid used in the composition, and the third solvent(s) comprise at least from 1-10% by volume of the liquid used in the composition. In one embodiment the ratio of the first, second, and third solvent are 41%, 15%, 3%, respectively, by volume with the remaining volume being the active material(s) and any other additional composition components such as additional solvent, dispersing aid or the like. In one embodiment the ratio of the first, second, and third solvent is 39%, 14.3%; 2.85%, respectively, by volume with the remaining volume being the active material(s) and any other additional composition components such as additional solvent, dispersing aid or the like.

In one embodiment the ratio of the first, second, and third solvent is 45%, 18%, 2%, respectively, by volume with the remaining volume being the active material(s) and any other additional composition components such as additional solvent, dispersing aid or the like.

In one embodiment, a fourth solvent is used in the composition in an amount of no more than 45% by volume of the composition; in other embodiments, a fourth solvent is between 40 and 42% by volume of the composition.

In some embodiments, there may be other components in the composition, including one or more additional solvents, dispersing agents, or other materials that may affect the miscibility of the various compositional components in the composition and/or the surface tension of the resulting composition.

In one embodiment, the active material(s) is/are no more than 50% by volume of the composition. In one embodiment, the active material(s) is/are no more than 30% by volume of the composition; in one embodiment, the active material(s) is/are no more than 15% by volume of the composition; in one embodiment, the active material(s) is/are no more than 7% by volume of the active material; in one embodiment, the active material(s) is/are no more than 3% of the composition; in one embodiment, the active material(s) is/are no more than 1% of the composition; in one embodiment, the active material(s) is/are no more than 0.5% volume of the composition; in one embodiment, the active material(s) is/are no more than 0.25% of the volume of the composition; and in one embodiment, the active material(s) is/are no more than 0.15% by volume of the composition.

Figure 2:
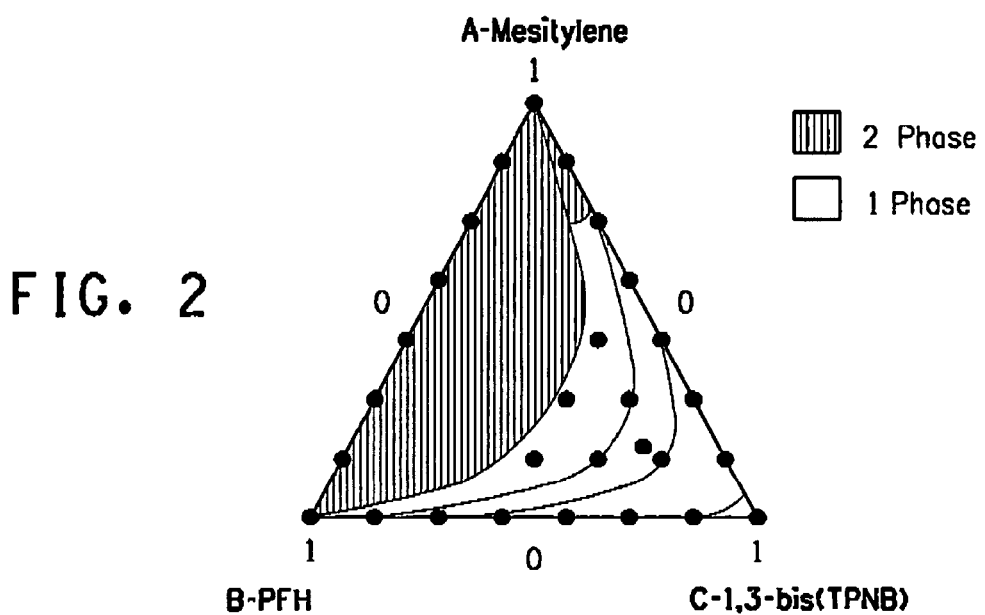
FIG. 2 is a Phase Diagram for three specific solvents useful in one embodiment of composition described herein.

In one embodiment, the composition is a clear liquid. In one embodiment the composition is a liquid single-phase mixture. The relative amounts of each of the solvents used in the composition for a single-phase composition can be determined empirically by creating various combinations (at weight or volume percents) of the solvents and observing when there is a single liquid phase of the solvents. See FIG. 1, Phase Map, for an illustration of this concept generally, and see FIG. 2, Phase Map, for an embodiment comprising the solvents Mesitylene, Perfluorinated heptane, and 1,3, bistrifluoromethylbenzene (TFMB).

In one embodiment, one solvent is selected from the group consisting of chloroform, dichloromethane, toluene, anisole, 3,4-dimethylanisole, p-xylene, o-xylene, m-xylene, phenyl, hexane, diethyl benzene, 4-methylanisole, mesitylene, or 1,2-dichlorobenzene and mixtures thereof; in one embodiment a second solvent is selected from the group consisting of isopropanol or 1,2-bistrifluoromethylbenzene and mixtures thereof; and a third solvent is selected from a perfluorinated alkane, such as perfluoroheptane or the solvents described in U.S. Pat. No. 7,531,700, incorporated by reference herein. In another embodiment, the composition may further include at least one fourth solvent selected from alcohols, ketones, cyclic ethers, polyols, dimethylacetamide ("DMAc"), N methylpyrrolidone ("NMP"), dimethylformamide ("DMF"), furan or ethylene glycol ("EG"), or mixtures thereof.

In one embodiment the composition comprises a light emitting polymer or a hole transporting polymer and mesitylene, perfluorinated heptane, 1,3-bis(TPMB) and tetrahydrofuran. In one embodiment the active material comprises from 0.15% to 5% of a composition including mesitylene, perfluorinated heptane, and 1,3-bis(TPMB). In one embodiment the active material comprises from 0.15% to 3% of a composition including mesitylene, perfluorinated heptane, 1,3-bis (TPMB) and tetrahydrofuran.

In one embodiment, the active material includes at least one fluorescent dye, fluorescent or a phosphorescent metal complex, photoactive small molecule, or photoactive polymer. In one embodiment, the active material includes at least one hole transport material. In one embodiment, the active material includes at least one electron transport material. In one embodiment, the composition includes at least one charge carrying host and at least one dopant. In one embodiment, either or both the host and the dopant may emit light having a wavelength in the range of 380 nm to 720 nm. In one embodiment, the dopant emits light having a wavelength of from about 400 to about 520 nm; in one embodiment the dopant emits light having a wavelength of from about 520 to about 620 nm; in one embodiment the dopant emits light having a wavelength of from about 550 to about 700 nm. In one embodiment there are more than one host and more than one dopant.

In one embodiment having two dopants, the dopants emit light having having two wavelength ranges for the light emitted.

In one embodiment, the voltage necessary to cause the active material to emit light is less than 30 V; in another embodiment, the voltage necessary to cause the active material to emit light is less than 20 V; in another embodiment, the voltage necessary to cause the active material to emit light is less than 15 V; in another embodiment, the voltage necessary to cause the active material to emit light is less than 10 V; in another embodiment, the voltage necessary to cause the active material to emit light is less than 5 V; and in another embodiment, the voltage necessary to cause the active material to emit light is less than 3 V.

In one embodiment, the active material includes at least one light emitting polymer. In one embodiment, the active material includes at least one light emitting active material that is selected from the group consisting of conjugated polymers, non-conjugated polymers, fluorenes, poly(paraphenylenevinylene) polyspiro, carbazoles, pyrroles, and dendimer-based materials (whether compound, polymer, or oligomers), and derivatives of the foregoing, and mixtures and combinations thereof. Examples of conjugated polymers include, but are not limited to poly(phenylenevinylenes), polyfluorenes, poly(spirobifluorenes), polythiophenes, poly (p-phenylenes), copolymers thereof, and mixtures thereof.

Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512.

Photoactive materials and charge transporting organic materials are described in a variety of technical publications from many sources and a wide variety of materials can be purchased or prepared from a variety of commercial materials and information made available by a variety sources too numerous to mention all herein. Nevertheless, such sources include Covion Organic Semicoductors, Sumitomo Chemical, Sumation, Cambridge Display Technologies, H.T. Starck, Fuji Chemical and Dow Chemicals to name but a few. In one embodiment the active material is selected from light emitting polymers or charge transport as described in WO 2005/049689; WO 2005/052027; WO 2005/049689; WO 01/66618 (which are incorporated herein by reference). For example, other illustrative embodiments include having the active material selected from the compounds, polymers and compositions described and disclosed in EP 0294061; WO 92/03490; WO 94/15441; WO 96/20253; WO 98/04610; WO 01/62869; WO 01/62822; and WO 01/66618; U.S. Pat. No. 6,955,773; U.S. Pat. No. 7,074,885; U.S. Pat. No. 6,620,307; U.S. Pat. No. 7,112,688; U.S. Pat. No. 7,431,866; U.S. Pat. No. 7,033,646; U.S. Pat. No. 7,005,088; U.S. Patent Application Publication No. 2004/0185302; U.S. Patent Application Publication No. 2004/0097725; U.S. Pat. No. 6,962,995; U.S. Pat. No. 7,198,730; U.S. Pat. No. 7,005,088; U.S. Pat. No. 7,138,483 and U.S. Pat. No. 7,074,886.

Other suitable active materials for other embodiments are described in the following (all incorporated by reference):

U.S. Patent Application Publication No. 2004/0124504; U.S. Pat. No. 7,112,368; U.S. Pat. No. 7,431,866; U.S. Pat. No. 7,033,646; U.S. Pat. No. 7,005,088; U.S. Pat. No. 7,098,060; U.S. Pat. No. 7,049,392; U.S. Patent Application Publication No. 2005/0100657; U.S. Pat. No. 7,132,681; U.S. Pat. No. 7,399,432; U.S. Pat. No. 7,462,298; U.S. Pat. No. 7,119,360; U.S. Patent Application Publication No. 2005/0100657; U.S. Pat. No. 7,132,681; U.S. Pat. No. 7,161,172; U.S. Pat. No. 7,183,366; U.S. Pat. No. 7,005,088; U.S. Pat. No. 7,476,452; U.S. Pat. No. 7,250,461; U.S. Pat. No. 7,087,323; U.S. Pat. No. 7,132,174; U.S. Pat. No. 7,074,534; U.S. Pat. No. 7,399,432; U.S. Pat. No. 7,265,378 and U.S. Pat. No. 6,953,705.

In one embodiment, the composition comprises at least one active material selected from anthracenes, naphthalenes, phenanthrenes, pyrenes, chrysenes, and perylenes, and materials based thereon (whether compounds, polymers, or oligomers) and derivatives of the foregoing, and mixtures and combinations thereof.

In one embodiment, the active material is selected from the group consisting of arylamines, triaylamines, aryl substited oxadazoles, aryl-substitued phenanthroline, tertiary amines, and mixtures thereof.

The term "active" when referring to a layer or material is intended to mean a layer or material that exhibits electronic or electro-radiative properties. An active layer material may emit radiation or exhibit a change in concentration of electron-hole pairs when receiving radiation. Thus, the term "active material" refers to a material which electronically facilitates the operation of the device. Examples of active materials include, but are not limited to, materials which conduct, inject, transport, or block a charge, where the charge can be either an electron or a hole. Active materials can be light emitters or photosensitive materials, and can be small molecules, polymers, or organometallic complexes. Examples of inactive materials include, but are not limited to, planarization materials, insulating materials, and environmental barrier materials.

Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink-jet printing, gravure printing, and screen printing. As used herein, the term "liquid composition" or "liquid medium" is intended to mean a material that is predominantly a liquid, and encompasses solutions, suspensions, dispersions, emulsions, and the like.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

The composition is useful in liquid deposition of active materials in the manufacture of organic electronic devices. In one embodiment the composition is useful in the liquid deposition of active materials onto a dry layer or film having a surface tension of about 20 mN/m or lower. In one embodiment, the composition has a surface tension that is equal to or lower than surface tension of the dry layer or film onto which it is being deposited.

In one embodiment, the composition is useful in liquid deposition of active materials onto a dry layer or film comprising at least one electrically conducting polymeric acid colloid material, including those described in U.S. patent application Ser. Nos. 10/669,494; 10/804,503; 10,669,422; 11/165,158; 10/803,113; 10/669,577; 10/802,341; 10/802,704; 10/803,114; 10/815,054; and 10/814,917 (all of which are incorporated herein by reference).

The term "substrate" is intended to mean a workpiece that can be either rigid or flexible and may include one or more layers of one or more materials, which can include, but are not limited to, glass, polymer, metal, film, or ceramic materials, or combinations thereof.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

By utilizing the compositions described above, it is possible to create a liquid composition comprising the active material to be deposited during the manufacture of the organic electronic device and that this liquid composition will evenly distribute the active material to achieve the desired result in the electronic device.

Advantages may be experienced from using one or more embodiments of the composition described above. A non-inclusive list of some advantage for some embodiments include permitting an all liquid deposition process for deposition active materials in making an organic device, enable new processes that may eliminate waste from the currently used liquid deposition techniques such as spin-coating or ink-jetting, reduce flammability when using fluorinated components, permit precision deposition and patterning of active material, and reducing manufacturing steps in the making of an organic device.

Figure 3:
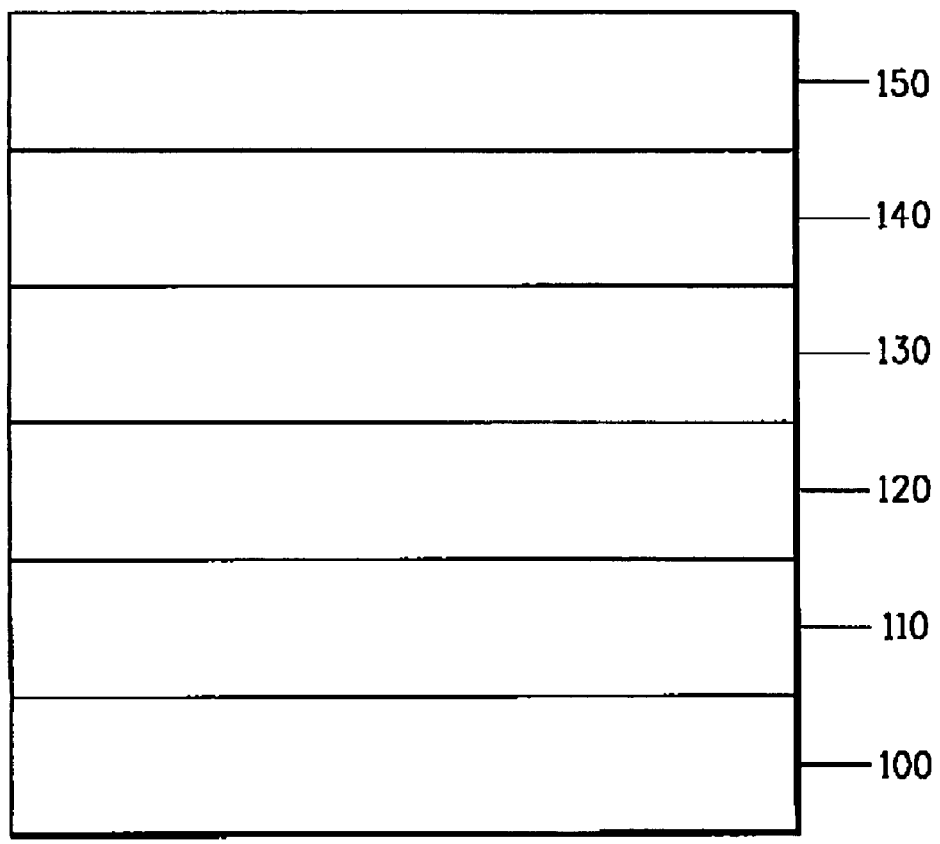
FIG. 3 illustrates one example of an organic electronic device (OLED) that may benefit from the described composition.

FIG. 3 is a schematic of an exemplary electronic device, an organic light-emitting diode (OLED) display, and includes a photoactive layer positioned between two electrical contact layers. The electronic device 100 includes buffer layer 110, a hole transport layer 120 located between the photoactive layer 130 and an anode layer 100. An optional electron transport layer 140 is located between the photoactive layer 130 and a cathode layer 150. Depending on the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Both hole transporting "small" molecules as well as oligomers and polymers may be used. Hole transporting molecules include, but are not limited to: N,N' diphenyl-N,N'-bis(3-methylphenyl)-[1,1'-biphenyl]-4,4'-diamine (TPD), 1,1 bis[(di-4-tolylamino) phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), a-phenyl 4-N,N-diphenylaminostyrene (TPS), p(diethylamino)benzaldehyde diphenylhydrazone (DEH), triphenylamine (TPA), bis[4 (N,N-diethylamino)-2-methylphenyl](4-methylphenyl)methane (MPMP), 1 phenyl-3-[p-(diethylamino) styryl]-5-[p-(diethylamino)phenyl]pyrazoline (PPR or DEASP), 1,2 trans-bis(9H-carbazol-9-yl)cyclobutane (DCZB), N,N,N',N' tetrakis(4-methylphenyl)-(1,1'-biphenyl)-4,4'-diamine (TTB); 4,4',N,N', dicarbazolyl-biphenyl (CBP); and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

Examples of photodetectors include photoconductive cells, photoresistors, photoswitches, phototransistors, phototubes, and photovoltaic cells The device is not limited with respect to system, driving method, and utility mode.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A liquid composition for depositing an active material on a substrate comprising:
    at least one active material;
    at least one first solvent capable of dissolving, suspend or dispersing the active material or materials;
    at least one second solvent having a surface tension equal to or lower than the surface tension of the substrate; and
    at least one third solvent capable of enhancing the miscibility of the first and second solvents while not leading to significant precipitation of the active material or materials from the composition, wherein at least one first solvent is selected from the group consisting of chloroform, dichloromethane, toluene, anisol, 3,4-dimethylanisole, 4-methylanisole, p-xylene, o-xylene, m-xylene, benzene, 1,2-dichlorobenzene, hexane, diethyl benzene, and mesitylene, and mixtures thereof;
    at least one second solvent is selected from the group consisting of isopropanol and 1,2-bis-trifluoromethylbenzene, and mixtures thereof; and
    at least one third solvent is selected from the group consisting of perfluoroalkanes.

2. A composition of claim 1 wherein the first solvent(s) comprises from 15% to 90% of the composition, the second solvent(s) comprises from 9% to 84% of the composition, the third solvent(s) comprises from 1% to 10% of the composition, with the remaining volume comprising active material (s) and optional additional components, wherein all percentages are by volume.

3. A composition of claim 2 wherein the ratio of percentages by volume of the first, second and third solvents in the composition is 41:15:3, with the remaining volume comprising the active material(s) and optional additional components.

4. A composition of claim 2 wherein the ratio of percentages by volume of the first, second and third solvents in the composition is 39:14.3:2.85, with the remaining volume comprising the active material(s) and optional additional components.

5. A composition of claim 2 wherein the ratio of percentages by volume of the first, second and third solvents in the composition is 45:18:2, with the remaining volume comprising the active material(s) and optional additional components.

6. A composition of claim 1 further comprising a fourth solvent in an amount no more than 45% by volume of the composition.

7. A composition of claim 2 wherein the active material(s) comprise(s) from 0.15% to 50% by volume of the composition.

8. A composition of claim 6 wherein the fourth solvent is selected from the group consisting of alcohols, ketones, cyclic ethers, polyols, dimethylacetamide, N-methylpyrrolidone, dimethylformamide, furan, and ethylene glycol, and mixtures thereof.

9. A composition of claim 1 wherein the active material(s) is/are selected from the group consisting of light-emitting polymers and hole transporting polymers.

10. A composition of claim 6 in which the solvents comprise mesitylene, perfluorinated heptane, 1,3-bis-trifluoromethylbenzene, and tetrahydrofuran.

11. A composition of claim 10 wherein the active material comprises from 0.15% to 3% by volume of the composition.

12. A composition of claim 1 wherein the active material(s) include(s) at least one fluorescent dye, fluorescent or phosphorescent metal complex, photoactive small molecule, or photoactive polymer.

13. A composition of claim 1 wherein the active material(s) include(s) at least one hole transport material.

14. A composition of claim 1 comprising at least one charge-carrying host and at least one dopant.

15. A composition of claim 14 comprising two dopants having two emission wavelength ranges.

16. A composition of claim 9 wherein the light-emitting polymer(s) is/are selected from the group consisting of conjugated polymers, non-conjugated polymers, fluorenes, poly (paraphenylenevinylene) polyspiro, carbazoles, pyrroles, and dendimer-based materials (whether compound, polymer, or oligomers), and derivatives of the foregoing, and mixtures and combinations thereof, wherein examples of conjugated polymers include, but are not limited to poly(phenylenevinylenes), polyfluorenes, poly(spirobifluorenes), polythiophenes, poly(p-phenylenes), copolymers thereof, and mixtures thereof.

17. A composition of claim 1 wherein the active material(s) is/are selected from the group consisting of anthracenes, naphthalenes, phenanthrenes, pyrenes, chrysenes, and perylenes, and materials based thereon including compounds, polymers, or oligomers, and derivatives of the foregoing, and mixtures and combinations thereof.

18. A composition of claim 1 which is a clear liquid.

19. A composition of claim 1 which is a single phase mixture.

* * * * *